United States Patent [19]

Fujii

[11] Patent Number: 5,119,334
[45] Date of Patent: Jun. 2, 1992

[54] DYNAMIC RANDOM ACCESS MEMORY HAVING IMPROVED WORD LINE CONTROL

[75] Inventor: Yasuhiro Fujii, Kawasaki, Japan

[73] Assignee: Fujitsu Limited, Kawasaki, Japan

[21] Appl. No.: 493,395

[22] Filed: Mar. 14, 1990

[30] Foreign Application Priority Data

Mar. 20, 1989 [JP] Japan ................................ 1-68403

[51] Int. Cl.$^5$ .......................... G11C 7/00; G11C 8/00
[52] U.S. Cl. ............................... 365/189.11; 365/204; 365/230.06
[58] Field of Search .............. 365/189.11, 204, 230.06; 307/578

[56] References Cited

U.S. PATENT DOCUMENTS

| | | | |
|---|---|---|---|
| 4,095,282 | 6/1978 | Oehler | 365/189.11 |
| 4,484,312 | 11/1984 | Nakano et al. | 365/189.11 |
| 4,628,486 | 12/1986 | Sakui | 365/189.11 |
| 4,649,523 | 3/1987 | Holder, Jr. et al. | 365/204 |
| 4,748,349 | 5/1988 | McAlexander, III et al. | 365/189.11 |
| 4,760,559 | 7/1988 | Hidaka et al. | 365/189.11 |
| 4,896,297 | 1/1990 | Miyatake et al. | 365/189.11 |
| 4,901,280 | 2/1990 | Patel | 365/189.11 |
| 4,954,731 | 9/1990 | Dhong et al. | 365/204 |

FOREIGN PATENT DOCUMENTS

| | | | |
|---|---|---|---|
| 0091596 | 5/1983 | Japan | 365/204 |
| 107484 | 6/1984 | Japan . | |
| 244489 | 10/1988 | Japan . | |
| 1622296 | 6/1989 | Japan . | |

Primary Examiner—Joseph A. Popek
Assistant Examiner—Michael A. Whitfield
Attorney, Agent, or Firm—Staas & Halsey

[57] ABSTRACT

A dynamic random access memory including a memory cell array, an address supply part, a data input/output part and a word line driver. The word line driver increases word lines to a first voltage during a first predetermined period after a first timing when the address supply circuit selects one of the word lines for reading out data and a second predetermined period after a second timing when the address supply circuit releases the one of the word lines from a selected state and maintains the one of the word lines at a second voltage less than the first voltage during an interval between the first and second predetermined periods.

23 Claims, 9 Drawing Sheets

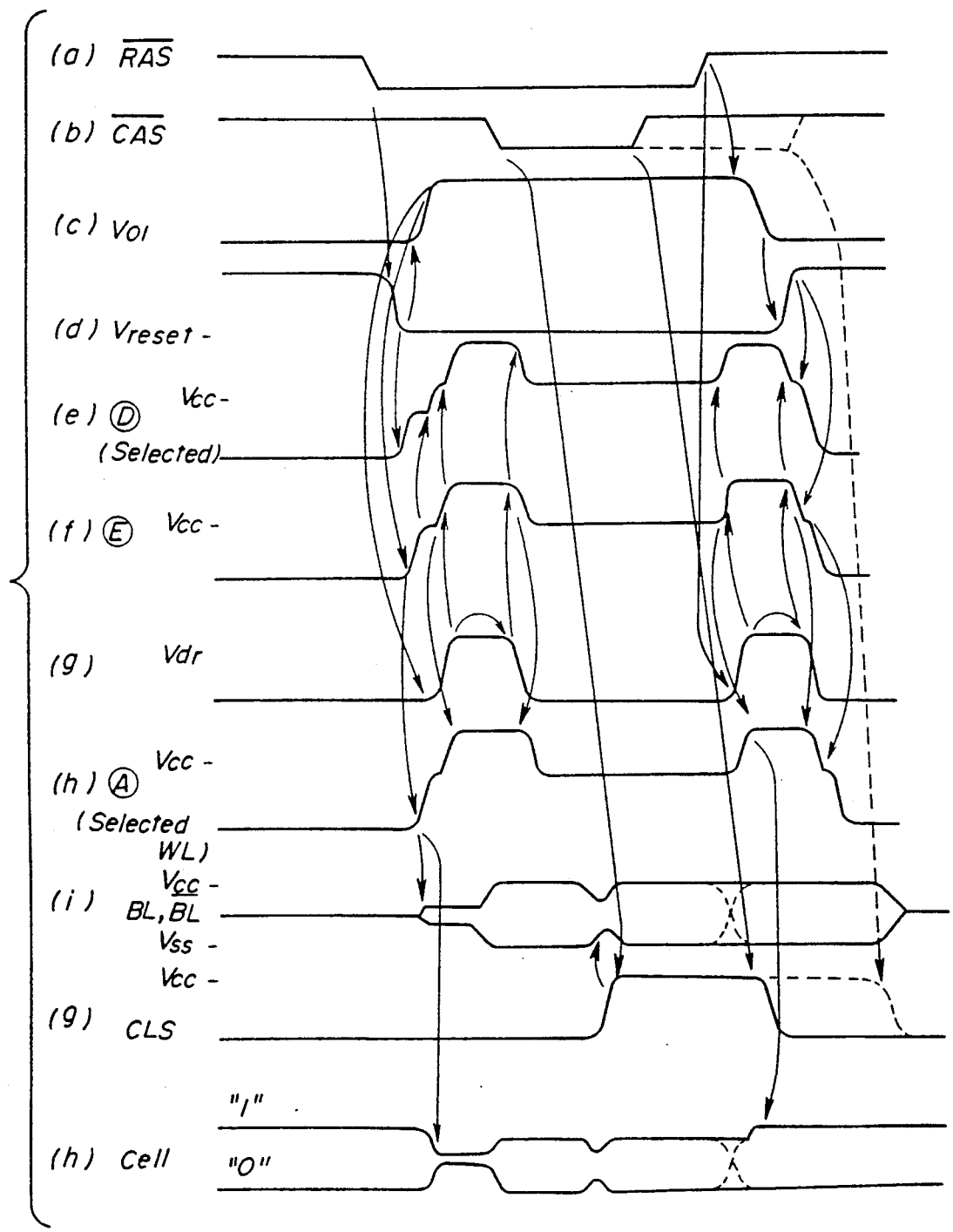

DYNAMIC RANDOM ACCESS MEMORY HAVING IMPROVED WORD LINE CONTROL

BACKGROUND OF THE INVENTION

The present invention generally relates to a dynamic random access memory, and particularly to an improvement in word line control. More particularly, the present invention is concerned with an improvement in boosting the potential of word lines when reading data from a memory cell array.

A dynamic random access memory has memory cells, each of which is composed of a memory cell transistor and a capacitor, for example. Information is stored in the capacitor in the form of a charge. When reading information from a selected memory cell, a word line voltage applied to the gate of the transistor through a corresponding word line is boosted up. On the other hand, a gate insulating film of the transistor, such as a silicon oxide film is getting thinner to provide a reduced memory cell transistor. A boosted-up word line voltage applied to the gate of the memory cell transistor causes an increased intensity of the electric field between the gate electrode and diffused regions of the transistor. When the boosted-up word line voltage is being applied for a long time, a stress is continuously applied to the gate insulating film. Such a stress deteriorates the transistor, such as a decrease in the mutual conductance or a breakdown of the gate insulating film.

As is well known, the capacity of memory cell capacitors decreases with an increase in the operating speed and integration density of DRAM memory. From this viewpoint, there is a need for boosting up the potential of a selected word line to a voltage higher than at least a threshold voltage of the memory cell transistor so that the word line rise rapidly and a sufficient write voltage is applied to the gate thereof. For example, Japanese Laid-Open Patent Application No. 59-107484 discloses a semiconductor memory device in which the potential of a selected word line is boosted up to a voltage higher than the gate threshold voltage Vth of the transistor, such as a positive power source voltage Vcc, or Vcc - Vth.

As described above, the gate is maintained at a voltage higher than the gate threshold voltage Vth during readout operation. Thus, there is a problem that a large stress is applied to the gate insulating film so that the transistor is deteriorated. Further, there is a possibility that the word line voltage is decreased due to the occurrence of a leakage current at a high-potential node so that the rewriting operation or the word line reset operation cannot be performed rapidly.

SUMMARY OF THE INVENTION

It is a general object of the present invention to provide an improved dynamic random access memory in which the aforementioned disadvantages are eliminated.

A more specific object of the present invention is to provide a dynamic random access memory in which the potential of a selected word line is boosted up rapidly when reading out data and a sufficient voltage for data write is provided without causing a deterioration of the gate insulating film of each memory cell transistor as well as a current leakage at a high-potential node.

The above objects of the present invention are achieved by a dynamic random access memory comprising a memory cell array having a plurality of memory cells coupled to bit lines and word lines; and word line driving means, coupled to the word lines, for applying a selection voltage to the word lines during a word line selection period and for temporarily boosting the selection voltage during a first predetermined period at the start of the word line selection period and during a second predetermined period at the end of the word line selection period.

The above-mentioned objects of the present invention are also achieved by a dynamic random access memory comprising a memory cell array having a plurality of memory cells coupled to bit lines and word lines; address supply means, coupled to the memory cell array, for supplying an address signal to the memory cell array to thereby select at least one of &he word lines and at least one of the bit lines from among the bit and word lines; and data input/output means, coupled to the memory cell array, for reading out data from the memory cell array and writing data into the memory cell array in accordance with the address signal. The dynamic random access memory also comprises word line driving means, coupled to the memory cell array and the address supply means, for increasing the word lines up to a first voltage during a first predetermined period after a first timing when the address supply means selects the at least one of the word lines for reading out data and a second predetermined period after a second timing when the address supply means releases the at least one of the word lines from a selected state and for maintaining the at least one of the word lines at a second voltage less than the first voltage during an interval between the first and second predetermined periods.

The aforementioned objects of the present invention are also achieved by a dynamic random access memory comprising a memory cell array having a plurality of memory cells coupled to bit lines and word lines; address supply means, coupled to the memory cell array, for supplying an address signal to the memory cell array to thereby select at least one of the word lines and at least one of the bit lines from among the bit and word lines; data input/output means, coupled to the memory cell array, for reading out data from the memory cell array and writing data into the memory cell array in accordance with the address signal; and word line driving means, coupled to the memory cell array and the address supply means, for increasing the word lines up to a first voltage during a predetermined period after a timing when the address supply means releases the at least one of the word lines from a selected state after reading out data and for maintaining the at least one of the word lines at a second voltage less than the first voltage until the at least one of the word lines is released from the selected state. The word line driving means includes a capacitor provided for each of the word lines and having a first end coupled to a corresponding one of the word lines and a second end; a delay circuit receiving a timing signal defining the timing from an external device and outputting a delayed timing signal; and gate means for receiving the timing signal and the delayed timing signal and for providing the second end of each of the capacitors with a driving signal which is the result of a logic operation between the timing signal and the delayed timing signal.

Further objects, features and advantages of the present invention will become apparent from the following detailed description when read in conjunction with the accompanying drawings.

BRIEF DESCRIPTION OF THE DRAWINGS

FIG. 9 is a waveform diagram of signals appearing at parts of the configuration shown in FIG. 2 in the case where the driving signal generator has the structure shown in FIG. 7.

DESCRIPTION OF THE PREFERRED EMBODIMENTS

Figure 1:
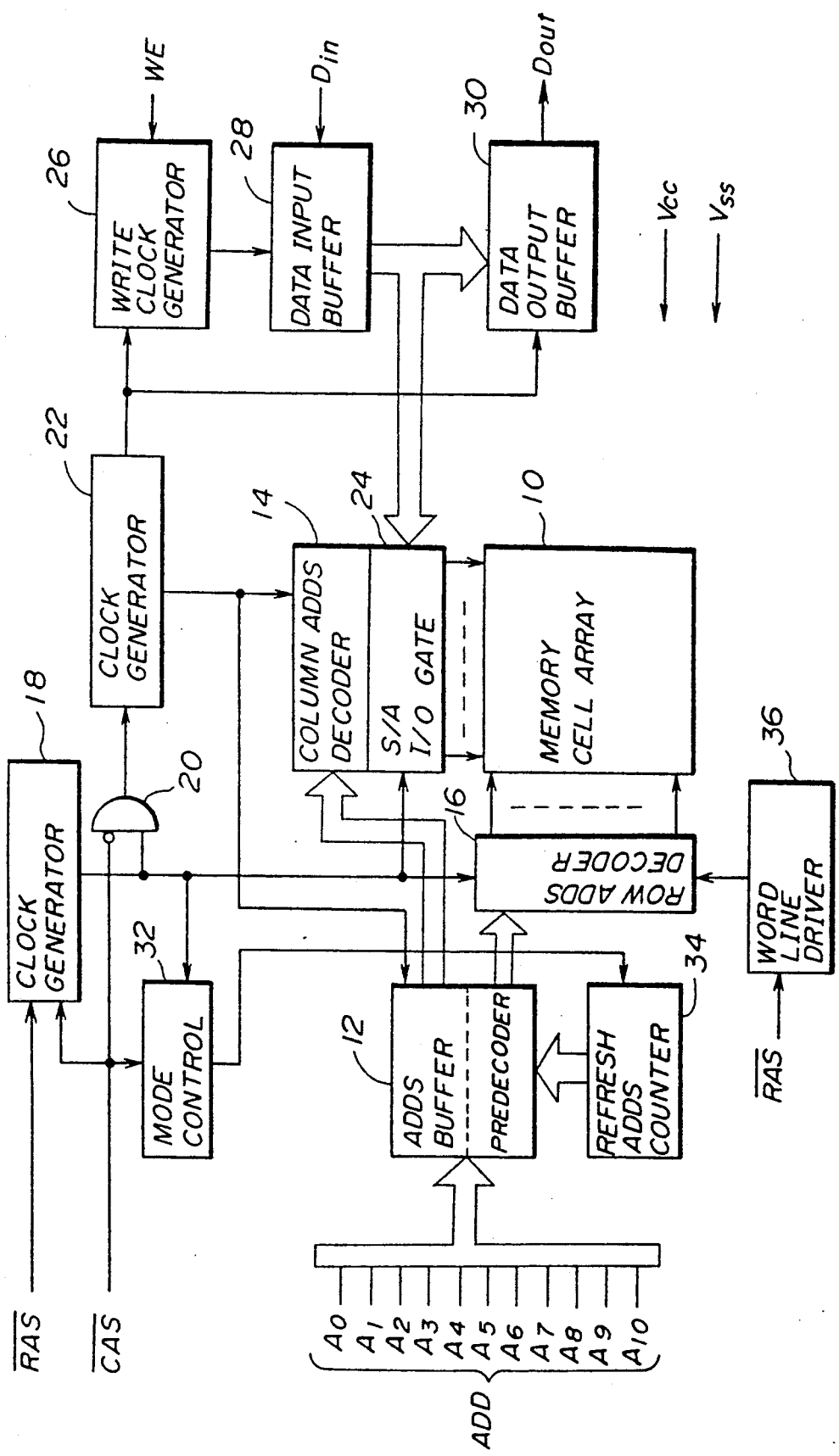
FIG. 1 is a block diagram of the entire structure of a dynamic random access memory according to the present invention.

A description will be given of a dynamic random access memory (DRAM) according to a first embodiment of the present invention. Referring to FIG. 1, there is illustrated the entire structure of a DRAM according to the present invention. The DRAM includes a memory cell array 10, which has a plurality of memory cells arranged into a matrix and coupled to word lines and bit lines.

A multiplexed address signal ADD consisting of address bits $A_0$ to $A_{10}$ is input to an address buffer/predecoder 12, which generates a column address signal to be supplied to a column address decoder 14 and a row address signal to be supplied to a row address decoder 16. A row address strobe signal $\overline{RAS}$ from an external device (not shown) such as a central processing unit (CPU) is input to a clock generator 18, which generates a clock signal to be supplied to the row address decoder 16. The row address strobe signal $\overline{RAS}$ is a low-active signal and defines a timing at which at least one of the word lines is selected by the row address decoder 16, and a timing at which at least selected one of the word lines is released from the selected state. The row address strobe signal $\overline{RAS}$ defines a timing at which the word lines are precharged and a timing at which the word lines are reset. A sense amplifier and input/output gate 24 is connected to the column address decoder 14 and the memory cell array 10.

A column address strobe signal $\overline{CAS}$ from the external device is input to an AND gate 20 through an inverter. The clock signal from the clock generator 18 is applied to the AND gate 20, an output signal of which is input to a clock generator 22. In response to the column address strobe signal $\overline{CAS}$, the clock generator 22 generates a clock signal to be supplied to the column address decoder 14 as well as the address buffer/predecoder 12. When receiving the clock signal from the clock generator 22, the column address decoder 14 selects a corresponding one of pairs of bit lines or more. The sense amplifier and input/output gate 24 are coupled to the bit lines extending to the memory cell array 10. When writing data Din into the memory cell array 10 or reading out data Dout therefrom, the data is amplified by a sense amplifier provided in the sense amplifier and input/output gate 24.

A write clock generator 26 receives the clock signal from the clock generator 22 and a write enable signal $\overline{WE}$ supplied from the external device, and generates a write clock. A data input buffer 28 inputs data Din at a timing defined by the write clock supplied from the write clock generator 26. Data output from the data input buffer 28 is input to the sense amplifier and input/output gate 24 and is written into the memory cell array 10. Data output from the sense amplifier and input/output gate 24 is input to a data output buffer 30, which outputs the input data in synchronism with the clock signal from the clock generator 22. A mode controller 32 receives the column address strobe signal $\overline{CAS}$ and the clock signal from the clock generator 18, and generates a mode signal corresponding to predetermined conventional operation modes, such as a read/write mode or a rewrite mode. The mode signal from the mode controller 32 is input to a refresh address counter 34, which generates an address signal relating to a memory cell to be refreshed.

A word line driver 36 is coupled to the row address decoder 16. The word line driver 36 receives the row address strobe signal $\overline{RAS}$, and generates a driving signal Vdr for boosting up the potential of a selected one of the word lines. The word line driver 36 is configured according to a first embodiment of the present invention, as will be described in detail later.

Figure 2:
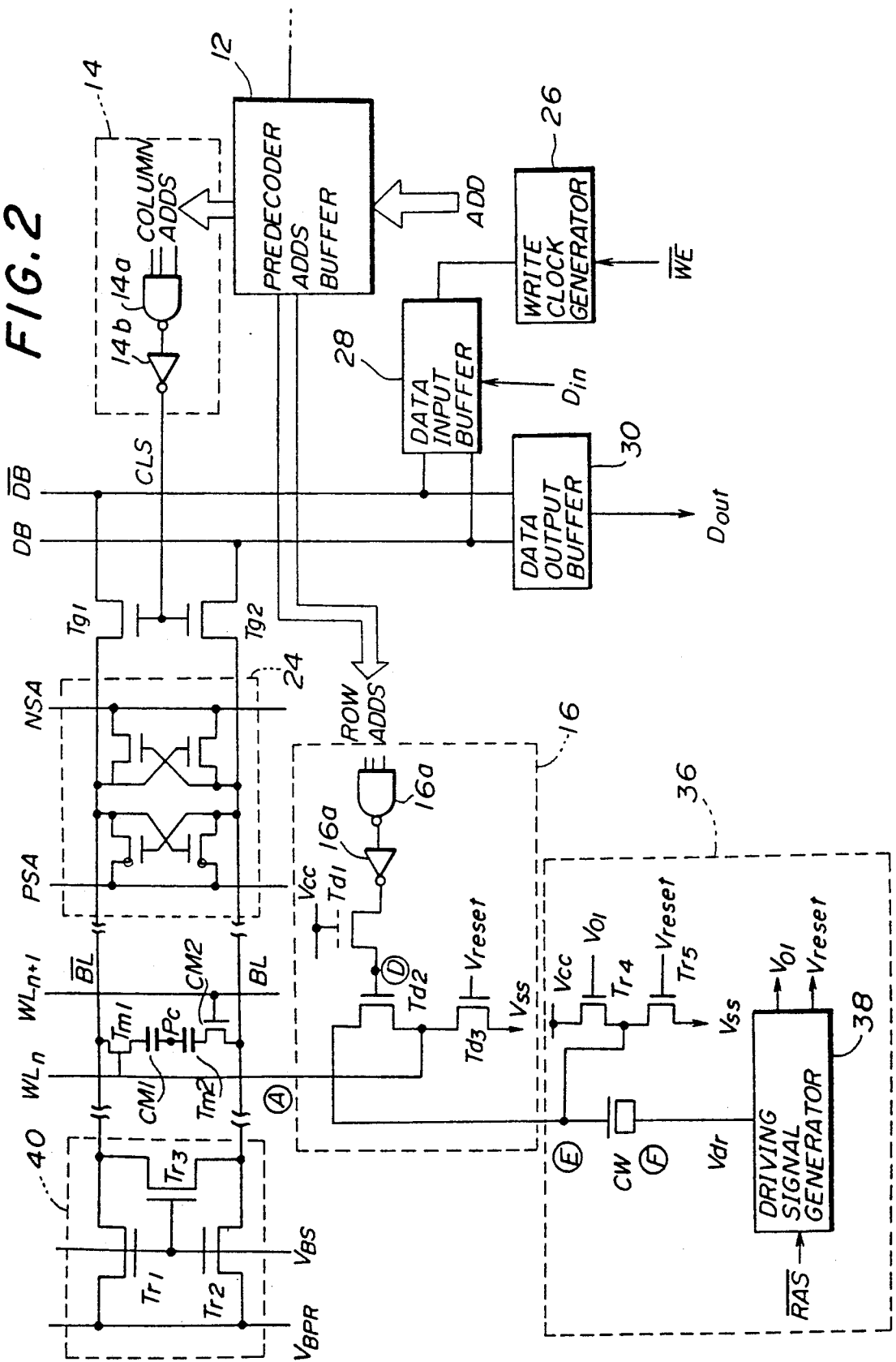
FIG. 2 is a circuit diagram of a part of the structure shown in FIG. 1 which relates to a pair of bit lines.

FIG. 2 is a circuit diagram of a part of the configuration shown in FIG. 1 relating to a pair of bit lines. A pair of bit lines BL and $\overline{BL}$ is connected to a bit line precharge circuit 40, which is composed of three MOS (metal oxide semiconductor) transistors Tr1, Tr2 and Tr3. A bias volta $V_{BS}$ is applied to the gates of the transistors Tr1, Tr2 and Tr3 so that a bit line precharge sign $V_{BPR}$ is applied to the bit lines BL and $\overline{BL}$. Normally, the bit line precharge signal $V_{BPR}$ is set to $\frac{1}{2}$Vcc. A memory cell transistor Tm1 of an insulated gate type such as the MOS type is connected to the bit line $\overline{BL}$, and a memory cell transistor Tm2 of the MOS type is connected to the bit line BL. The gate of the transistor Tm1 is connected to a word line WLn, and the gate of the transistor Tm2 is connected to a word line WLn+1. A memory cell capacitor CM1 is connected to the transistor Tm1, and a memory cell capacitor CM2 is connected to the transistor Tm2. A node Pc at which the capacitors CM1 and CM2 are mutually connected is set to $\frac{1}{2}$Vcc, for example. A plurality of memory cell transistors and capacitors (not shown) are coupled to the bit lines BL and $\overline{BL}$. The sense amplifier 24 is composed of two PMOS transistors and two NMOS transistors. The PMOS transistors are driven by a signal PSA, and the NMOS transistors are driven by a signal NSA. The bit lines BL and are connected to a pair of data bus lines DB and $\overline{DB}$ through transfer gate transistors Tg1 and Tg2, respectively. The gates of the transistors Tg1 and Tg2 are controlled by the column address decoder 14, which includes a NAND gate 14a and an inverter 14b associated with the bit lines BL and $\overline{BL}$.

The row address decoder 16 includes a NAND gate 16a, an inverter 16b, and three MOS transistors Td1, Td2 and Td3. The output terminal of the inverter 16b is coupled to the gate of the transistor Td2 through the transistor Td1. A reset signal Vreset is applied to the gate of the transistor Td3. The source of the transistor Td3 is provided with a negative power source voltage Vss. The source of the transistor Td2 and the drain of the transistor Td3 are connected to the word line WLn. The drain of the transistor Td2 is connected to a capacitor Cw, which is a part of the word line driver 36.

Figure 3:
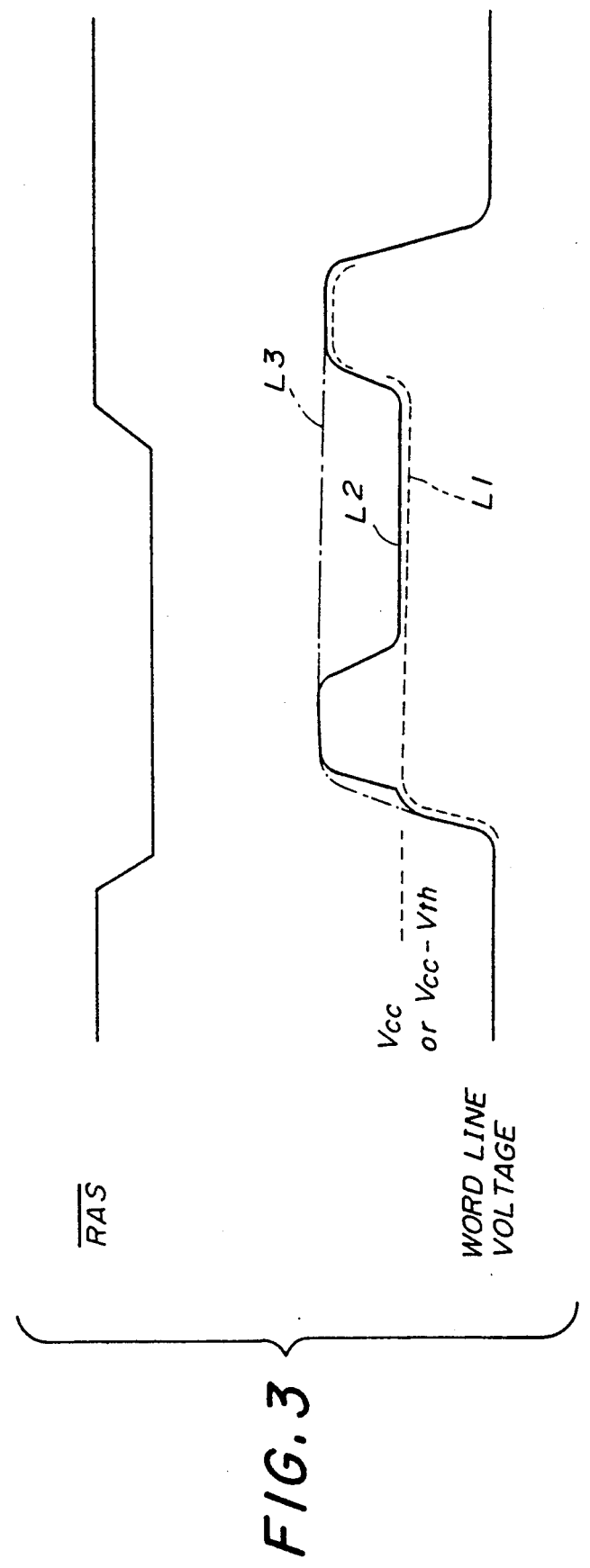
FIG. 3 is a waveform diagram illustrating functions of a word line driver shown in FIGS. 1 and 2.

The word line driver 36 includes the capacitor Cw, MOS transistors Tr4 and Tr5, and a driving signal generator 38, which controls the capacitor Cw and the MOS transistors Tr4 and Tr5. The driving signal generator 38 is provided in common to the word lines. The drain of the transistor Tr4 is supplied with the positive power source voltage Vcc. The source of the transistor Tr4 is connected to the drain of the transistor Tr5 and one of the terminals of the capacitor Cw. The source of the transistor Tr5 is supplied with the negative power source voltage Vss. The driving signal generator 38 according to the first embodiment of the present invention operates as indicated by broken line L1 shown in FIG. 3. In response to the fall of the row address strobe signal $\overline{RAS}$ which selects the word line WLn (FIG. 2), the driving signal generator 38 controls the word line WLn so that it rises to Vcc or Vcc - Vth where Vth is the gate threshold voltage of each memory cell transistor. Then the word line WLn is maintained at this voltage. When the row address strobe signal $\overline{RAS}$ rises and become inactive, the word line driver 36 controls the word line WLn so that it increases to a voltage higher than Vcc or Vcc - Vth for a predetermined period and then decreases to Vss. It is noted that conventionally the word line WLn is controlled as indicated by one-dotted chain line L3 shown in FIG. 3.

Figure 4:
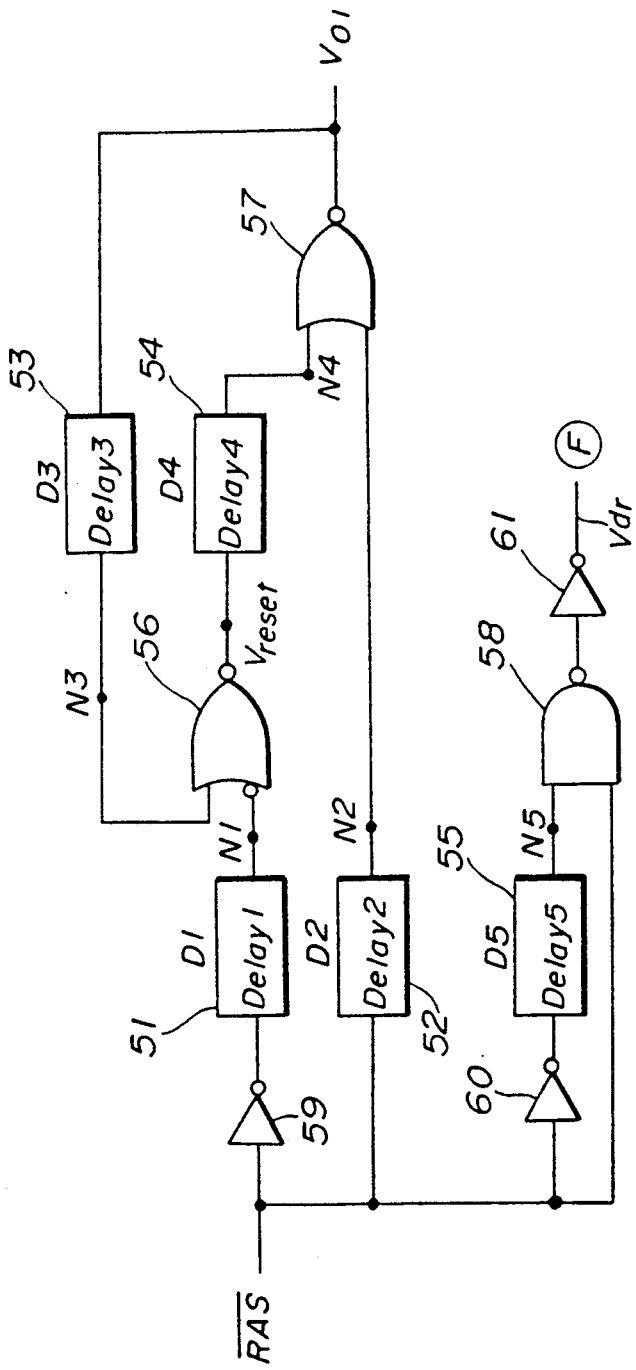
FIG. 4 is a circuit diagram of a driving signal generator provided in the word line driver shown in FIGS. 1 and 2 according to a first embodiment of the present invention.

FIG. 4 is a circuit diagram of the driving signal generator 38 according to the first embodiment of the present invention. The driving signal generator 38 is composed of delay circuits 51, 52, 53, 54 and 55 respectively providing delays of time D1, D2, D3, D4 and D5, NOR gates 56 and 57, a NAND gate 58, and inverters 59, 60 and 61. Each of the delay circuits 51 -55 is formed by, for example, serially connected inverters. The row address strobe signal $\overline{RAS}$ is applied to the inverter 59, the delay circuit 52, the inverter 60 and the NAND gate 58. An output signal from the inverter 59 is delayed by delay time D1 through the delay circuit 51, and then input to the NOR gate 56. An output signal from the NOR gate 56, Vreset, is delayed by delay time D4 through the delay circuit 54, and then applied to the NOR gate 57. The reset signal Vreset from the NOR gate 56 is also applied to the gate of the transistor Td3 and the gate of the transistor Tr5 shown in FIG. 2. The row address strobe signal $\overline{RAS}$ is delayed by delay time D2 through the delay circuit 52, and then applied to the NOR gate 57. An output signal (precharge signal) Vo1 from the NOR gate 57 is delayed by delay time D3 through the delay circuit 53, and then applied to the NOR gate 56. The signal from the NOR gate 57 is applied, as the precharge signal Vo1, to the gate of the transistor Tr4. The row address strobe signal $\overline{RAS}$ is applied to the delay circuit 55 through the inverter 60 and is then delayed by delay time D5. A delayed output signal from the delay circuit 55 is applied to the NAND gate 58, which is also supplied with the row address strobe signal $\overline{RAS}$. An output signal from the NAND gate 58 passes through the inverter 61 and is applied, as the driving signal Vdr, to the capacitor Cw shown in FIG. 2.

Figure 5:
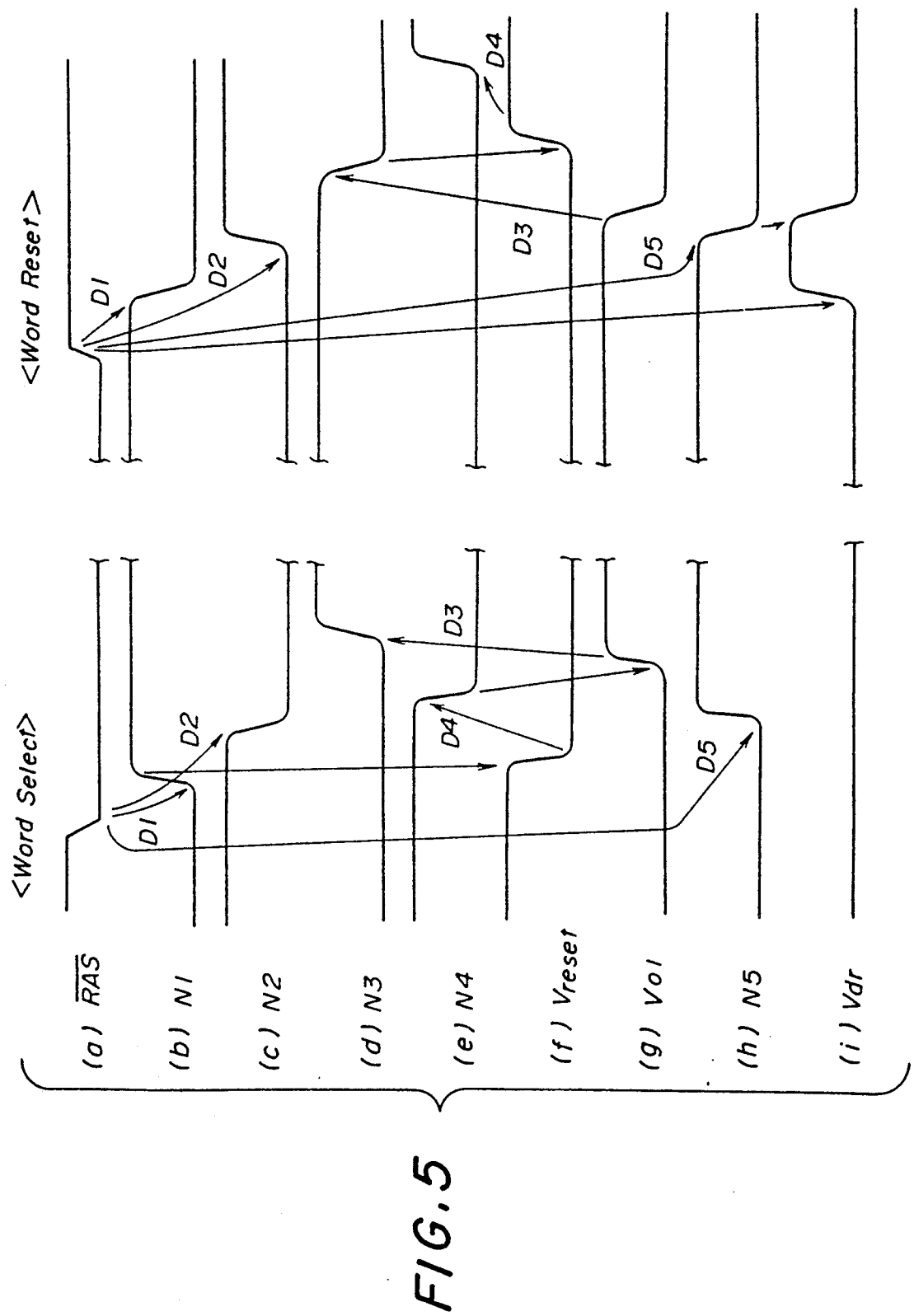
FIG. 5 is a waveform diagram of signals appearing at parts of the driving signal generator shown in FIG. 4.

FIG. 5 is a waveform diagram of signals observed at parts of the circuit shown in FIG. 4. Waveforms N1-N5 shown in FIG. 5 corresponds to nodes N1-N5 shown in FIG. 4. Referring to FIGS. 4 and 5, the row address strobe signal $\overline{RAS}$ falls so that the word line WLn (FIG. 2) is selected. The rise of the output signal from the delay circuit 51 lags behind the fall of the row address strobe signal $\overline{RAS}$ by delay of time D1 ((a) and (b) of FIG. 5), and the fall of the output signal from the delay circuit 52 lags behind the fall of the signal $\overline{RAS}$ by delay of time D2 ((a) and (c) of FIG. 5). The rise of the output signal from the delay circuit 55 lags behind the fall of the row address strobe signal $\overline{RAS}$ by delay of time D5 ((a) and (h) of FIG. 5). Delay of time D5 is approximately 10 nanoseconds, for example. In response to the rise of the signal at node N1, the reset signal Vreset falls ((f) of FIG. 5). In response to the fall of the reset signal Vreset, the signal from the delay circuit 54 falls with delay of time D4 from the fall of the reset signal Vreset ((e) of FIG. 5). In response to the fall of the signal at node N4, the output signal from the delay circuit 53 rises with delay of time D3 ((d) of FIG. 5). It is noted that there is no change in the driving signal Vdr from the inverter 61 during the above-mentioned operation.

The row address strobe signal $\overline{RAS}$ rises and the word line WLn is reset in the following operation. The signal at node N1 falls with delay of time D1 from the rise of the row address strobe signal $\overline{RAS}$, ((a) and (b) of FIG. 5) and the signal at node N2 rises with delay of time D2 therefrom ((b) and (c) of FIG. 5). In response to the rise of the row address strobe signal $\overline{RAS}$, the voltage signal to be supplied to the capacitor Cw shown in FIG. 2 from the driving signal generator 38 rises (FIG. 5 (i)). After time D5 passes from the rise of the row address strobe signal $\overline{RAS}$, the signal at node N5 falls ((h) of FIG. 5). In response to the fall of the signal at node N5, the driving signal Vdr from the inverter 61 falls ((i) of FIG. 5). The signals at nodes N3, N4 and signals Vreset and Vo1 change as shown in (d), (e), (f) and (g) of FIG. 5.

Figure 6:
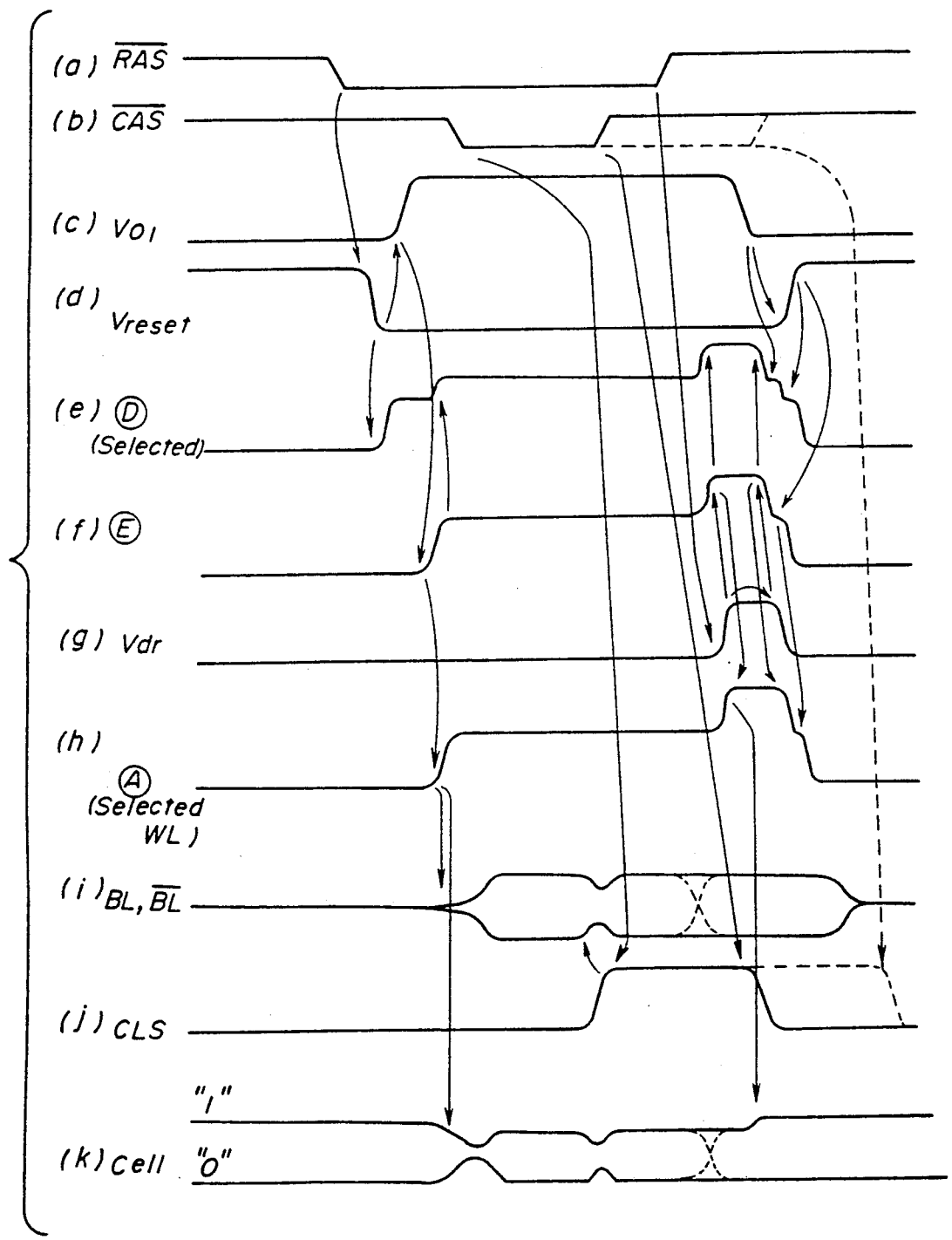
FIG. 6 is a waveform diagram showing the operation of the dynamic random access memory shown in FIGS. 1 and 2 according to the first embodiment of the present invention.

According to the above-mentioned operation of the word line driver 36, the circuit shown in FIGS. 2 and 4 operates as shown in FIG. 6. Referring to FIGS. 2 and 6, the reset signal Vreset from the driving signal generator 38 falls in response to the row address strobe signal $\overline{RAS}$ with delay D1 ((a) and (d) of FIG. 6). Thereby, the word line WLn and the capacitor Cw are switched to a floating state. Then the precharge signal Vo1 from the driving signal generator 38 rises ((c) of FIG. 6) so that the transistor Tr4 is turned ON and the node E is precharged ((f) of FIG. 5). When the word line WLn is selected, the potential of the node D increases ((e) of FIG. 5). In response to the rise of the potential of the node E, the potential of the node D is further increased ((e) of FIG. 5). When the transistor Td2 is turned ON, the potential of the word line WLn (at node A) increases to a potential approximately equal to Vcc or Vcc - Vth ((h) cf FIG. 6) because the node E is precharged. Thereby, the memory cell transistor Tm1 is turned ON and thus the capacitor CM1 becomes connected to the bit line $\overline{BL}$. A charge stored in the capacitor CM1 is output to the bit line $\overline{BL}$ so that the potential of the bit line $\overline{BL}$ is slightly increased ((i) of FIG. 5). At this time, the voltage of the capacitor CM1 changes as shown in (k) of FIG. 6. The potential difference between the bit lines BL and $\overline{BL}$ increases due to the function of the sense amplifier 24 as shown in (i) of FIG. 6.

After that, the column address strobe signal $\overline{CAS}$ falls ((b) of FIG. 6), and then the column select signal CLS from the column address decoder 14 applied to the transistors Tg1 and Tg2 (FIG. 2) rises ((j) of FIG. 6). Thereby, the transistors Tg1 and Tg2 are turned ON and the potential difference between the bit lines BL and $\overline{BL}$ are transferred to the data bus lines DB and $\overline{DB}$. Then the column address strobe signal $\overline{CAS}$ rises as shown in (b) of FIG. 6, and the column select signal CLS falls as shown in (j) of FIG. 6. Then the row address strobe signal $\overline{RAS}$ rises ((a) of FIG. 6). In response to this change of the signal $\overline{RAS}$, the driving signal Vdr from the inverter 61 (FIG. 4) rises and then falls ((g) of FIG. 6). In response to the rise of the signal shown in (g) of FIG. 6, the potential of the node E is further increased as shown in (f) of FIG. 6, and the voltage of the word line WLn is caused to exceed Vcc or Vcc - Vth ((e) of FIG. 6). In response to the fall of the signal shown in (g) of FIG. 6, the potential of the node E and the word line voltage at node A are decreased ((e) and (f) of FIG. 6). When the precharge signal Vol falls, the potential of the node E and the word line voltage are further decreased. Then the reset signal Vreset rises ((d) of FIG. 6) so that the word line WLn and the node E are discharged through the transistors Td3 and the Tr5, respectively ((h) of (f) of FIG. 6). Broken lines indicates the operation in the rewriting mode.

A description is given of a structure for the driving signal generator 38 according to a second preferred embodiment of the present invention. The driving signal generator 38 according to the second embodiment of the present invention operates as indicated by solid line L2 shown in FIG. 3. The driving signal generator 38 is directed to improving one shown in FIG. 4. In the case where the driving signal generator 38 shown in FIG. 4 is used, there is a possibility that the voltage of the selected word line WLn is not sufficient to quickly cause the potential difference between the bit lines BL and $\overline{BL}$ (see (i) of FIG. 6). For this reason, the readout of the charge stored in the memory cell capacitor is not so fast as shown in (k) of FIG. 6. The above-mentioned problem appears greatly at memory cells which are far from the word line driver 36.

Figure 7:
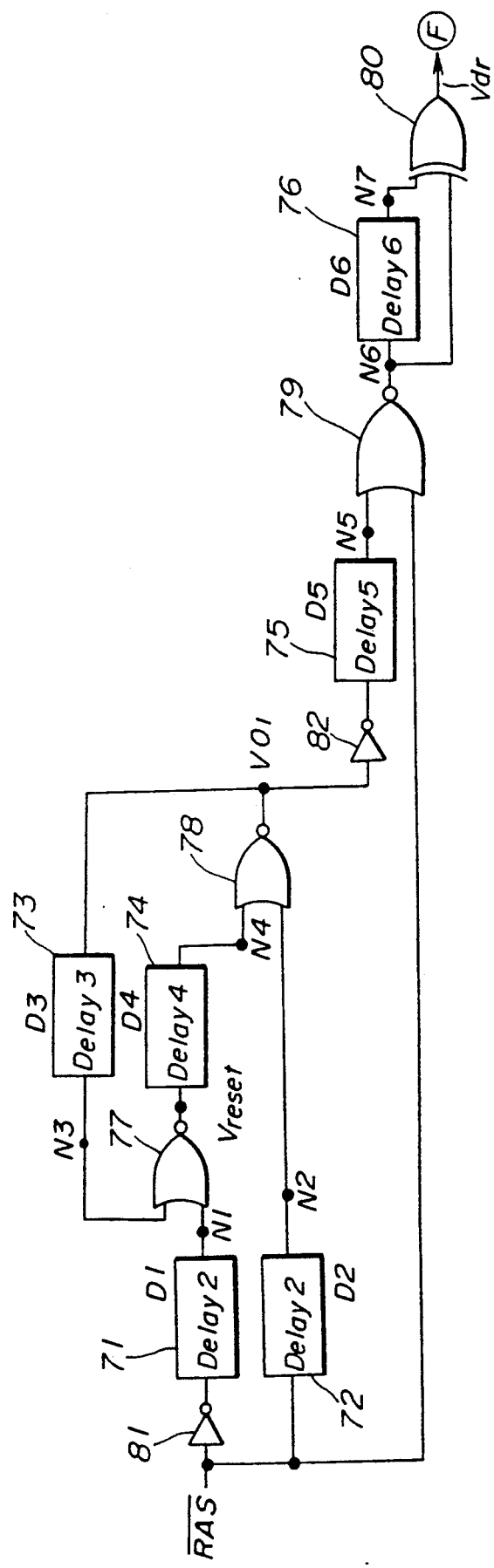
FIG. 7 is a circuit diagram of another driving signal generator according to a second embodiment of the present invention.

Referring to FIG. 7, there is illustrated a configuration of the driving signal generator 38 according to the second embodiment of the present invention. Referring to FIG. 7, the driving signal generator 38 shown in FIG. 7 includes delay lines 71, 72, 73, 74, 75 and 76 providing delays of time D1, D2, D3, D4, D5 and D6, NOR gates 77, 78 and 79, an exclusive-OR gate 80, and inverters 81 and 82.

The row address strobe signal $\overline{RAS}$ is applied to the delay circuit 71 through the inverter 81, and then delayed by D1 through the delay circuit 71. An output signal from the delay circuit 71 is applied to the NOR gate 77, an output signal of which is delayed by D4 through the delay circuit 74 and then applied to the NOR gate 78. The output signal from the NOR gate 77 is supplied, as the reset signal Vreset, to the gates of the transistors Td3 and Tr5 (FIG. 2). The row address strobe signal $\overline{RAS}$ is delayed by D2 through the delay circuit 72 and then applied to the NOR gate 78. An output signal of the NOR gate 78 is delayed by D3 through the delay circuit 73 and then input to the NOR gate 77. The output signal of the NOR gate 78 is also supplied, as the precharge signal Vol, to the gate of the transistor Tr4 (FIG. 2). The output signal from the NOR gate 78 passes through the inverter 82 and then delayed by D5 through the delay circuit 75. An output signal from the delay circuit 75 is applied to the NOR gate 79, which is also supplied with the row address strobe signal $\overline{RAS}$. An output signal from the NOR gate 79 is delayed by D6 through the delay circuit 76 and then applied to the exclusive-OR gate 80, which is also supplied with the output signal from the NOR gate 79. An output signal from the exclusive-OR gate 80 is supplied, as the driving signal Vdr, to the capacitor Cw (FIG. 2).

Figure 8:
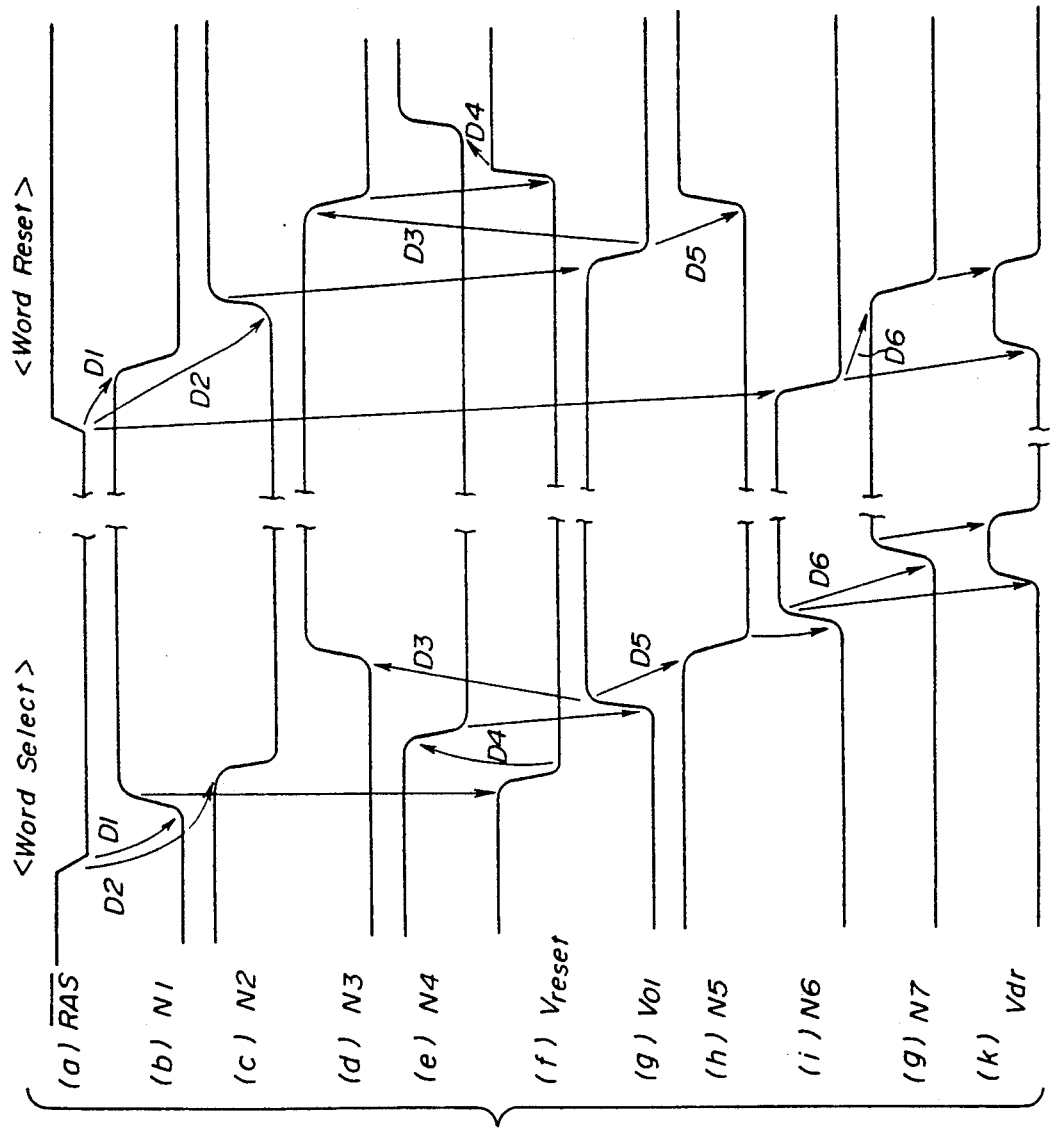
FIG. 8 is a waveform diagram of signals appearing at parts of the circuit shown in FIG. 7.

Referring to FIG. 8, the potential of the node N1 rises with delay of time D1 from the fall of the row address strobe signal $\overline{RAS}$ ((a) and (b) of FIG. 8), and the potential of the node N2 falls with delay of time D2 (>D1) from the fall of the signal $\overline{RAS}$ ((a) and (c) of FIG. 8). In synchronism with the rise of the potential of the node N1 ((b) of FIG. 8), the reset signal Vreset falls as shown in (f) of FIG. 8. The potential of the node N4 rises with delay of time D4 from the fall of the reset signal Vreset ((e) and (f) of FIG. 8). In response to the fall of the potential of the node N4, the precharge signal Vol rises ((g) of FIG. 8). The potential of the node N3 rises with delay of time D3 from the rise of the precharge signal Vol ((d) and (g) of FIG. 8). The potential of the node N5 falls with delay of time D5 from the rise of the precharge signal Vol ((g) and (h) of FIG. 8). In response to the fall of the node N5, the potential of the node N6 rises ((h) and (i) of FIG. 8). When the potential of the node N6 rises, the driving signal (Vdr) from the exclusive-OR gate 80 rises ((i) and (k) of FIG. 8). The potential of the node N7 starts to rise with delay of time D6 from the rise of the potential of the node N6 ((j)) of FIG. 8). When the potential of the node N7 is completely increased, the driving signal Vdr from the exclusive-OR gate 80 falls ((j) and (k) of FIG. 8).

When the row address strobe signal $\overline{RAS}$ rises, the potential of the node N6 falls ((i) of FIG. 7) and the driving signal Vdr from the exclusive-OR gate 80 starts to increase ((k) of FIG. 8). The potential of the node N7 falls with delay of time D6 from the fall of the potential of the node N6 ((i) and (j) of FIG. 8). On the other hand, in response to the rise of the row address strobe signal $\overline{RAS}$, the potentials of the nodes N1, N2, N3, N4 and N5 change as shown in (b), (c), (d), (e) and (h) of FIG. 8, and the reset signal Vreset changes as shown in (f) of FIG. 8.

A description will be given of the operation of the configuration shown in FIG. 2 in which the driving signal generator 38 has the configuration shown in FIG. 7. In response to the fall of the row address strobe signal $\overline{RAS}$ ((a) of FIG. 9), the reset signal Vreset falls ((d) of FIG. 9). In response to the fall of the reset signal Vreset, the potential of the node D (FIG. 2) increase as shown in (e) of FIG. 9. The precharge signal Vol starts to rise in response to the fall of the reset signal Vreset ((c) of FIG. 9). In response to the rise of the precharge signal Vol ((c) of FIG. 9), the potential of the node E and the potential of the node F start to rise ((f) and (g) of FIG. 9). The potential of the node E is increased with an increase in the potential of the node F ((f) of FIG. 9). The potential of the word line WLn rises with the increase of the potential of the node E ((f) and (h) of FIG. 9) and is maintained at Vcc or Vcc - Vth. In response to the fall of the potential of the node F ((i) of FIG. 9), the potential of the node E starts to fall ((f) of FIG. 9), and thus the potential of the word line WLn starts to fall ((h) of FIG. 9). When the potential of the word line WLn starts to increase, the potentials of the bit lines BL and $\overline{BL}$ change as shown in (i) of FIG. 9, and the voltage across the capacitor CM1 changes as shown in (k) of FIG. 9.

When the column address strobe signal $\overline{CAS}$ falls ((b) of FIG. 9), the column select signal CLS rises ((j) of FIG. 9 so that the potential difference between the bit lines BL and $\overline{BL}$ are transferred to the data bus lines DB and $\overline{DB}$. When the column address strobe signal $\overline{CAS}$ rises, the column select signal CLS falls ((j) of FIG. 9).

In response to the rise of the row address strobe signal $\overline{RAS}$ ((a) of FIG. 9), the potential of the node F starts to increase ((g) of FIG. 9). The potential of the node E increases with an increase in the potential of the node F ((f) and (g) of FIG. 9). The potential of the word line WLn increases with an increase in the potential of the node E ((f) and (h) of FIG. 9). In response to the fall of the potential of the node F ((g) of FIG. 9), the potential of the node E starts to decrease ((f) of FIG. 9). In response to the fall of the potential of the node E, the potential of the selected word line WLn starts to decrease ((h) of FIG. 9). On the other hand, the precharge signal Vol decreases in response to the rise of the row address strobe signal $\overline{RAS}$ ((b) and (c) of FIG. 9). In response to the fall of the precharge signal Vol ((c) of FIG. 9), the reset signal Vreset rises as shown in (d) of FIG. 9. In response to the rise of the reset signal, the potential of the node D is further decreased ((e) of FIG. 9), and the potential of the node E is further decreased ((f) of FIG. 9). In response to the further decrease of the potential of the node E, the potential of the selected word line WLn is further decreased to Vss ((h) of FIG. 9). Broken lines indicate the operation in the rewriting mode.

It can be seen from (i) and (k) of FIGS. 6 and 9 that the waveforms shown in (i) and (k) of FIG. 9 is improved as compared with those shown in (i) and (k) of FIG. 6.

The present invention is not limited to the specifically described embodiments, and variations and modifications may be made without departing from the scope of the present invention.

What is claimed is:

1. A dynamic random access memory, comprising:
a memory cell array having a plurality of memory cells coupled to bit lines and word lines; and
word line driving means, coupled to said word lines, for applying a selection voltage to said word lines during a word line selection period and for temporarily boosting said selection voltage during a first predetermined period at the start of said word line selection period and during a second predetermined period at the end of said word line selection period, wherein said word line driving means is connected to receive a row address strobe signal which defines said word line selection period and comprises:
a capacitor provided for each of said word lines and having a first end coupled to a corresponding one of said word lines and a second end; and
driving signal generating means, coupled to the second end of said capacitor, for generating a driving signal to be supplied to said capacitor, said driving signal having a first driving voltage to be set during each of said first and second predetermined periods and a second driving voltage, higher than the first driving voltage, to be set during an interval between said first predetermined period and said second predetermined period and comprising:
  delay means for delaying said row address strobe signal by a predetermined delay of time to thereby generate a delayed signal; and
  a logical gate circuit outputting the driving signal on the basis of the delayed signal and the row address strobe signal.

2. A dynamic random access memory as claimed in claim 1, wherein said dynamic random access memory is connectable to receive a first power source voltage and a second power source voltage, and said selection voltage is approximately equal to said first power source voltage, and wherein said word line driving means boosts said selection voltage to a voltage greater than said first power source voltage.

3. A dynamic random access memory as claimed in claim 1, wherein said dynamic random access memory is connectable to receive a first power source voltage and a second power source voltage, and each of said memory cells comprises:
a memory cell capacitor having a first end set to a predetermined voltage and a second end; and
a memory cell transistor of an insulated gate type having a gate connected to a corresponding one of said word lines, a first terminal connected to a corresponding one of said bit lines, and a second terminal coupled to the second end of said memory cell capacitor, and wherein:
said selection voltage is approximately equal to a voltage corresponding to a difference between said first power source voltage and a gate threshold voltage of said memory cell transistor; and
said word line driving means includes means for boosting said selecting voltage to a voltage greater than said voltage corresponding to said difference.

4. A dynamic random access memory as claimed in claim 1, wherein:
said dynamic random access memory is connectable to receive a first power source voltage and a second power source voltage;
said word line driving means comprises word line precharging means, coupled to each of said word lines, for precharging said word lines to said first power source voltage; and
a voltage generated by a charge stored in said capacitor by said first driving voltage is added to said first power source voltage to which said word lines are set so that said word lines are increased to said first voltage during each of said first and second predetermined periods.

5. A dynamic random access memory as claimed in claim 1, wherein:
said dynamic random access memory is connectable to receive a first power source voltage and a second power source voltage; and
said word line driving means further comprises word line reset means, coupled to each of said word lines, for resetting said word lines to said second power source voltage while said word lines are not provided with said selection voltage.

6. A dynamic random access memory as claimed in claim 5, wherein said word line driving means is provided with a row address strobe signal which defines said word line selection period.

7. A dynamic random access memory, comprising:

a memory cell array having a plurality of memory cells coupled to bit lines and word lines; and word line driving means, coupled to said word lines, for applying a selection voltage to said word lines during a word line selection period and for temporarily boosting said selection voltage during a first predetermined period at the start of said word line selection period and during a second predetermined period at the end of said word line selection period, wherein said word line driving means is connected to receive a row address strobe signal which defines said word line selection period, and wherein said word line driving means comprises:

a capacitor provided for each of said word lines and having a first end coupled to a corresponding one of the word lines and a second end;

delay means for delaying said row address strobe signal by a predetermined delay of time to thereby generate a delayed signal; and an exclusive-OR gate for receiving said row address strobe signal and said delayed signal from said delay means and for outputting a driving signal to said second end of the capacitor.

8. A dynamic random access memory as claimed in claim 7, wherein said row address strobe signal is a low-active signal, and said delay means comprises:

first, second, third, fourth, fifth and sixth delay circuits providing individual delays of time;

first, second and third NOR gates each having first and second input terminals and an output terminal; and first and second inverters;

said exclusive-OR gate having first and second input terminals and an output terminal, and wherein:

said row address strobe signal is supplied to the second input terminal of said first NOR gate through said first inverter and said first delay circuit connected in series;

said row address strobe signal is supplied to the second input terminal of said second NOR gate through said second delay circuit;

said row address strobe signal is supplied directly to the second input terminal of said third NOR gate;

said third delay circuit is connected between the first input terminal of said first NOR gate and the output terminal of said second NOR gate;

said fourth delay circuit is connected between the output terminal of said first NOR gate and the first input terminal of said second NOR gate;

an output signal from the output terminal of said second NOR gate is supplied to the first input terminal of said third NOR gate through said second inverter and said fifth delay circuit connected in series;

said sixth delay circuit is connected between the output terminal of said third NOR gate and the first input terminal of said exclusive-OR gate;

the output terminal of said third NOR gate is connected directly to the second input terminal of said exclusive-OR gate; and the output terminal of said exclusive-OR gate is connected to the second end of said capacitor.

9. A dynamic random access memory as claimed in claim 8, further comprising first and second MOS transistors each having a source, a drain and a gate, wherein:

the source of said first MOS transistor is connectable to receive a first power source voltage;

the drain of said first MOS transistor is connected to the source of said second MOS transistor and the first end of said capacitor;

the drain of said second MOS transistor is provided with a second power source voltage;

the output terminal of said first NOR gate is connected to the gate of said second MOS transistor; and the output terminal of said second NOR gate is connected to the gate of said first MOS transistor.

10. A dynamic random access memory, comprising:

a memory cell array having a plurality of memory cells coupled to bit lines and word lines;

address supply means, coupled to memory cell array, for supplying an address signal to said memory cell array to thereby select at least one of said word lines and at least one of said bit lines from among said bit and word lines;

data input/output means, coupled to said memory cell array, for reading out data from said memory cell array and writing data into said memory cell array in accordance with said address signal; and word line driving means, coupled to said memory cell array and said address supply means, for increasing said word lines to a first voltage during a first predetermined period after a first timing when said address supply means selects said at least one of the word lines for reading out data and during a second predetermined period after a second timing when said address supply means releases said at least one of the word lines from a selected state and for maintaining said at least one of the word lines at a second voltage less than said first voltage during an interval between said first and second predetermined periods, wherein said word line driving means is connected to receive a row address strobe signal which defines said word line selection period and comprises:

a capacitor provided for each of said word lines and having a first end coupled to a corresponding one of said word lines and a second end; and driving signal generating means, coupled to the second end of said capacitor, for generating a driving signal to be supplied to said capacitor, said driving signal having a first driving voltage to be set during each of said first and second predetermined periods and a second driving voltage, higher than the first driving voltage, to be set during said interval and comprising:

delay means for delaying said row address strobe signal by a predetermined delay of time to thereby generate a delayed signal; and a logical gate circuit outputting the driving signal on the basis of the delayed signal and the row address strobe signal.

11. A dynamic random access memory as claimed in claim 10, wherein said dynamic random access memory is connectable to receive a first power source voltage and a second power source voltage, and said second voltage is approximately equal to said first power source voltage.

12. A dynamic random access memory as claimed in claim 10, wherein said dynamic random access memory is connectable to receive a first power source voltage and a second power source voltage, and each of said memory cells comprises:

a memory cell capacitor having a first end set to a predetermined voltage and a second end; and a memory cell transistor of an insulated gate type having a gate connected to a corresponding one of said word lines, a first terminal connected to a corresponding one of said bit lines, and a second terminal coupled to the second end of said memory cell capacitor, and wherein said second voltage is approximately equal to a voltage corresponding to a difference between said first power source voltage and a gate threshold voltage of said memory cell transistor.

13. A dynamic random access memory as claimed in claim 10, wherein:

said dynamic random access memory is connectable to receive a first power source voltage and a second power source voltage;

said word line driving means further comprises word line precharging means, coupled to each of said word lines and said address supply means, for precharging said at least one of the word lines selected by said address supply means to said first power source voltage; and a voltage generated by a charge stored in said capacitor by said first driving voltage is added to said first power source voltage to which said at least one of the word lines is set so that said at least one of the word lines is increased to said first voltage during each of said first and second predetermined periods.

14. A dynamic random access memory as claimed in claim 10, wherein:

said dynamic random access memory is connectable to receive a first power source voltage and a second power source voltage; and said word line driving means further comprises word line reset means, coupled to each of said word lines and said address supply means, for resetting said word lines to said second power source voltage while said word lines are not selected.

15. A dynamic random access memory as claimed in claim 10, wherein said address supply means selects said at least one of the word lines in response to a row address strobe signal which defines said first and second timings and which is supplied from an external device.

16. A dynamic random access memory comprising:

a memory cell array having a plurality of memory cells coupled to bit lines and word lines;

address supply means, coupled to said memory cell array, for supplying an address signal to said memory cell array to thereby select at least one of said word lines and at least one of said bit lines from among said bit and word lines, wherein at least one of the word lines is selected in response to a row address strobe signal which defines said first and second timings and which is supplied from an external device;

data input/output means, coupled to said memory cell array, for reading out data from said memory cell array and writing data into said memory cell array in accordance with said address signal; and word line driving means, coupled to said memory cell array and said address supply means, for increasing said word lines to a first voltage during a first predetermined period after a first timing when said address supply means selects said at least one of the word lines for reading out data and during a second predetermined period after a second timing when said address supply means releases said at least one of the word lines from a selected state and for maintaining said at least one of the word lines at a second voltage less than said first voltage during an interval between said first and second predetermined periods wherein said word line driving means comprises:

a capacitor provided for each of said word lines and having a first end coupled to a corresponding one of the word lines and a second end;

delay means for delaying said row address strobe signal by a predetermined delay of time to thereby generate a delayed signal; and an exclusive-OR gate for receiving said row address strobe signal and said delayed signal from said delay means and for outputting a driving signal to said second end of the capacitor.

17. A dynamic random access memory as claimed in claim 18, wherein said row address strobe signal is a low-active signal, and said delay means comprises:

first, second, third, fourth, fifth and sixth delay circuits providing individual delays of time;

first, second and third NOR gates each having first and second input terminals and an output terminal; and an exclusive-OR gate having first and second input terminals and an output terminal; and first and second inverters, and wherein:

said row address strobe signal is supplied to the second input terminal of said first NOR gate through said first inverter and said first delay circuit connected in series;

said row address strobe signal is supplied to the second input terminal of said second NOR gate through said second delay circuit;

said row address strobe signal is supplied directly to the second input terminal of said third NOR gate;

said third delay circuit is connected between the first input terminal of said first NOR gate and the output terminal of said second NOR gate;

said fourth delay circuit is connected between the output terminal of said first NOR gate and the first input terminal of said second NOR gate;

an output signal from the output terminal of said second NOR gate is supplied to the first input terminal of said third NOR gate through said second inverter and said fifth delay circuit connected in series;

said sixth delay circuit is connected between the output terminal of said third NOR gate and the first input terminal of said exclusive-OR gate;

the output terminal of said third NOR gate is connected directly to the second input terminal of said exclusive-OR gate; and the output terminal of said exclusive-OR gate is connected to the second end of said capacitor.

18. A dynamic random access memory as claimed in claim 17, further comprising first and second MOS transistors each having a source, a drain and a gate, wherein:

the source of said first MOS transistor is connectable to receive a first power source voltage;

the drain of said first MOS transistor is connected to the source of said second MOS transistor and the first end of said capacitor;

the drain of said second MOS transistor is provided with a second power source voltage;

the output terminal of said first NOR gate is connected to the gate of said second MOS transistor; and the output terminal of said second NOR gate is connected to the gate of said first MOS transistor.

19. A dynamic random access memory as claimed in 18, wherein said address supply means comprises gate means provided for each of said word lines, for connecting said first end of the capacitor and a corresponding one of said word lines when said corresponding one of the word lines is selected.

20. A dynamic random access memory, comprising:
a memory cell array having a plurality of memory cells coupled to bit lines and word lines;
address supply means, coupled to said memory cell array, for supplying an address signal to said memory cell array to thereby select at least one of said word lines and at least one of said bit lines from among said bit and word lines;
data input/output means, coupled to said memory cell array, for reading out data from said memory cell array and writing data into said memory cell array in accordance with said address signal; and
word line driving means, coupled to said memory cell array and said address supply means, for increasing said word lines to a first voltage during a predetermined period after a timing when said address supply means releases said at least one of the word lines from a selected state after reading out data and for maintaining said at least one of the word lines at a second voltage less than said first voltage until said at least one of the word lines is released from the selected state,
said word line driving means including:
a capacitor provided for each of said word lines and having a first end coupled to a corresponding one of said word lines and a second end;
a delay circuit receiving a timing signal from an external device, defining said timing and outputting a delayed timing signal; and
gate means for receiving said timing signal and said delayed timing signal and for providing the second end of each of said capacitors with a driving signal which is the result of a logic operation between said timing signal and said delayed timing signal.

21. A dynamic random access memory as claimed in claim 20, wherein said word line driving means further comprises a first inverter through which said timing signal is supplied to said delay circuit and a second inverter through which said driving signal is supplied to the second end of each of said capacitors, and wherein said gate means includes a NAND gate having a first input terminal provided with said delayed timing signal, a second input terminal provided with said timing signal, and an output terminal through which said driving signal is output.

22. A dynamic random access memory as claimed in claim 21, further comprising first and second MOS transistors each having a source, a drain and a gate, wherein:
the source of said first MOS transistor is connectable to receive a first power source voltage;
the drain of said first MOS transistor is connected to the source of said second MOS transistor and the first end of said capacitor; and
the drain of said second MOS transistor is provided with a second power source voltage,
wherein said dynamic random access memory further comprises:
first, second, third and fourth delay circuits providing individual delays of time;
first and second NOR gates each having first and second input terminals and an output terminal; and
an inverter, and wherein:
said timing signal is supplied to the second input terminal of said first NOR gate through said inverter and said first delay circuit;
said timing signal is supplied to the second input terminal of said second NOR gate through said second delay circuit;
said third delay circuit is connected between the first input terminal of said first NOR gate and the output terminal of said second NOR gate;
said fourth delay circuit is connected between the output terminal of said first NOR gate and the first input terminal of said second NOR gate;
the output terminal of said first NOR gate is connected to the gate of said second MOS transistor; and
the output terminal of said second NOR gate is connected to the gate of said first MOS transistor.

23. A dynamic random access memory as claimed in claim 22, wherein said timing signal is a row address strobe signal which is a low-active signal when said at least one of said word lines is selected by said address supply means.

* * * * *